US012646578B2

(12) United States Patent
Hwang et al.

(10) Patent No.: US 12,646,578 B2
(45) Date of Patent: Jun. 2, 2026

(54) SEMICONDUCTOR DEVICE WITH TRANSFER CIRCUITS AND OPERATING METHOD INCLUDING ADJUSTMENT OF TRANSFER CONTROL SIGNAL AND PROGRAM PULSE

(71) Applicant: SK hynix Inc., Icheon-si (KR)

(72) Inventors: Sung Hyun Hwang, Icheon-si (KR); Hyun Seob Shin, Icheon-si (KR); Jae Yeop Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 279 days.

(21) Appl. No.: 18/347,401

(22) Filed: Jul. 5, 2023

(65) Prior Publication Data

US 2024/0312541 A1     Sep. 19, 2024

(30) Foreign Application Priority Data

Mar. 15, 2023     (KR) ........................ 10-2023-0033810

(51) Int. Cl.
| | |
|---|---|
| *G11C 16/08* | (2006.01) |
| *G11C 5/14* | (2006.01) |
| *G11C 11/56* | (2006.01) |
| *G11C 16/10* | (2006.01) |
| *G11C 16/32* | (2006.01) |
| *G11C 16/34* | (2006.01) |
| *G11C 16/04* | (2006.01) |
| *G11C 16/12* | (2006.01) |

(52) U.S. Cl.
CPC .......... *G11C 16/3495* (2013.01); *G11C 16/08* (2013.01); *G11C 16/10* (2013.01); *G11C 16/3459* (2013.01)

(58) Field of Classification Search
CPC ..... G11C 16/3495; G11C 16/08; G11C 16/10; G11C 16/3459; G11C 11/5628; G11C 16/0483; G11C 16/32; G11C 16/12; G11C 5/147; G11C 16/3404
See application file for complete search history.

(56) References Cited

U.S. PATENT DOCUMENTS

| | | | | |
|---|---|---|---|---|
| 10,269,409 | B2 | 4/2019 | Murakami | |
| 11,004,525 | B1 * | 5/2021 | Gautam | ............. G11C 16/3495 |
| 2009/0122615 | A1 * | 5/2009 | Jang | ..................... G11C 16/349 |
| | | | | 365/185.18 |
| 2010/0302864 | A1 * | 12/2010 | Kim | ................... G11C 16/3404 |
| | | | | 365/185.22 |
| 2011/0007572 | A1 * | 1/2011 | Ueno | .................. G11C 11/5628 |
| | | | | 365/185.22 |

(Continued)

FOREIGN PATENT DOCUMENTS

| | | | | | |
|---|---|---|---|---|---|
| KR | 20180001407 | A | * | 1/2018 | ......... G11C 16/0483 |
| KR | 102461747 | B1 | | 11/2022 | |

*Primary Examiner* — Sultana Begum
*Assistant Examiner* — Elizabeth Rose Agger
(74) *Attorney, Agent, or Firm* — WILLIAM PARK AND ASSOCIATES LTD.

(57) ABSTRACT

A semiconductor device may include a plurality of transfer circuits configured to transfer a program pulse to at least one of a plurality of word lines based on a transfer control signal, a decoder configured to provide the program pulse to at least one of the plurality of transfer circuits based on a row address, and a control circuit configured to adjust a voltage level of the transfer control signal based on a program/erase count.

21 Claims, 7 Drawing Sheets

(56)        References Cited

U.S. PATENT DOCUMENTS

| | | | |
|---|---|---|---|
| 2011/0310666 A1* | 12/2011 | Miida ................... | G11C 16/10 |
| | | | 365/185.11 |
| 2018/0211715 A1* | 7/2018 | Cho ....................... | G11C 16/10 |
| 2019/0103145 A1* | 4/2019 | Tseng .................... | G11C 16/24 |
| 2019/0385680 A1* | 12/2019 | Dunga .............. | G11C 16/0466 |

* cited by examiner

SEMICONDUCTOR DEVICE WITH TRANSFER CIRCUITS AND OPERATING METHOD INCLUDING ADJUSTMENT OF TRANSFER CONTROL SIGNAL AND PROGRAM PULSE

CROSS-REFERENCE TO RELATED APPLICATION

This application claims priority under 35 U.S.C. § 119(a) to Korean Patent Application No. 10-2023-0033810 filed on Mar. 15, 2023, in the Korean Intellectual Property Office, which is incorporated herein by reference in its entirety.

BACKGROUND

1. Technical Field

Embodiments relate to an integrated circuit technology and, more particularly, to a semiconductor device and an operating method of a semiconductor device.

2. Related Art

Recently, as electronic devices have been decreasing in size, consuming less power, having higher performance, and increasingly diversified, a semiconductor device capable of storing information is required for various electronic devices, such as computers and portable communication devices. The semiconductor device may be basically divided into a volatile memory device and a nonvolatile memory device. The volatile memory device has a fast data processing speed but has a disadvantage in that the volatile memory device needs to be continuously supplied with power in order to maintain data that has been stored in the volatile memory device. The nonvolatile memory device does not need to be continuously supplied with power in order to maintain data that has been stored in the nonvolatile memory device but has a disadvantage in that the nonvolatile memory device has a slow data processing speed.

In the nonvolatile memory device, research for improving efficiency in program operations that store data in a memory cell and improving a threshold voltage distribution of memory cells is continuously performed.

SUMMARY

In an embodiment, a semiconductor device may include a plurality of transfer circuits configured to transfer a program pulse to at least one of a plurality of word lines based on a transfer control signal, a decoder configured to provide the program pulse to at least one of the plurality of transfer circuits based on a row address, and a control circuit configured to adjust a voltage level of the transfer control signal based on a program/erase count.

In an embodiment, a semiconductor device may include a plurality of transfer circuits configured to transfer a program pulse to at least one of a plurality of word lines based on a transfer control signal, a decoder configured to provide the program pulse to at least one of the plurality of transfer circuits based on a row address, and a control circuit configured to adjust a voltage level of the transfer control signal so that a timing at which the voltage level of the transfer control signal reaches a maximum voltage level is earlier than a timing at which a voltage level of the program pulse reaches a maximum voltage level.

In an embodiment, an operating method of a semiconductor device may include setting an initial voltage level of a transfer control signal based on a program/erase count after a start of a program operation, setting an increment of a voltage level of the transfer control signal so that a timing at which the voltage level of the transfer control signal reaches a maximum voltage level is earlier than a timing at which a voltage level of a program pulse reaches a maximum voltage level, and setting a change in the voltage level of the transfer control signal based on results of program verification operations corresponding to a plurality of pieces of timing.

DETAILED DESCRIPTION

Hereinafter, embodiments according to the technical spirit of the present disclosure are described with reference to the accompanying drawings.

Embodiments of the present disclosure provide a semiconductor device and an operating method of a semiconductor device, which can improve efficiency of a program operation and a threshold voltage distribution of cells.

A threshold voltage distribution of cells can be improved, and efficiency of a program operation can also be improved.

Figure 1:
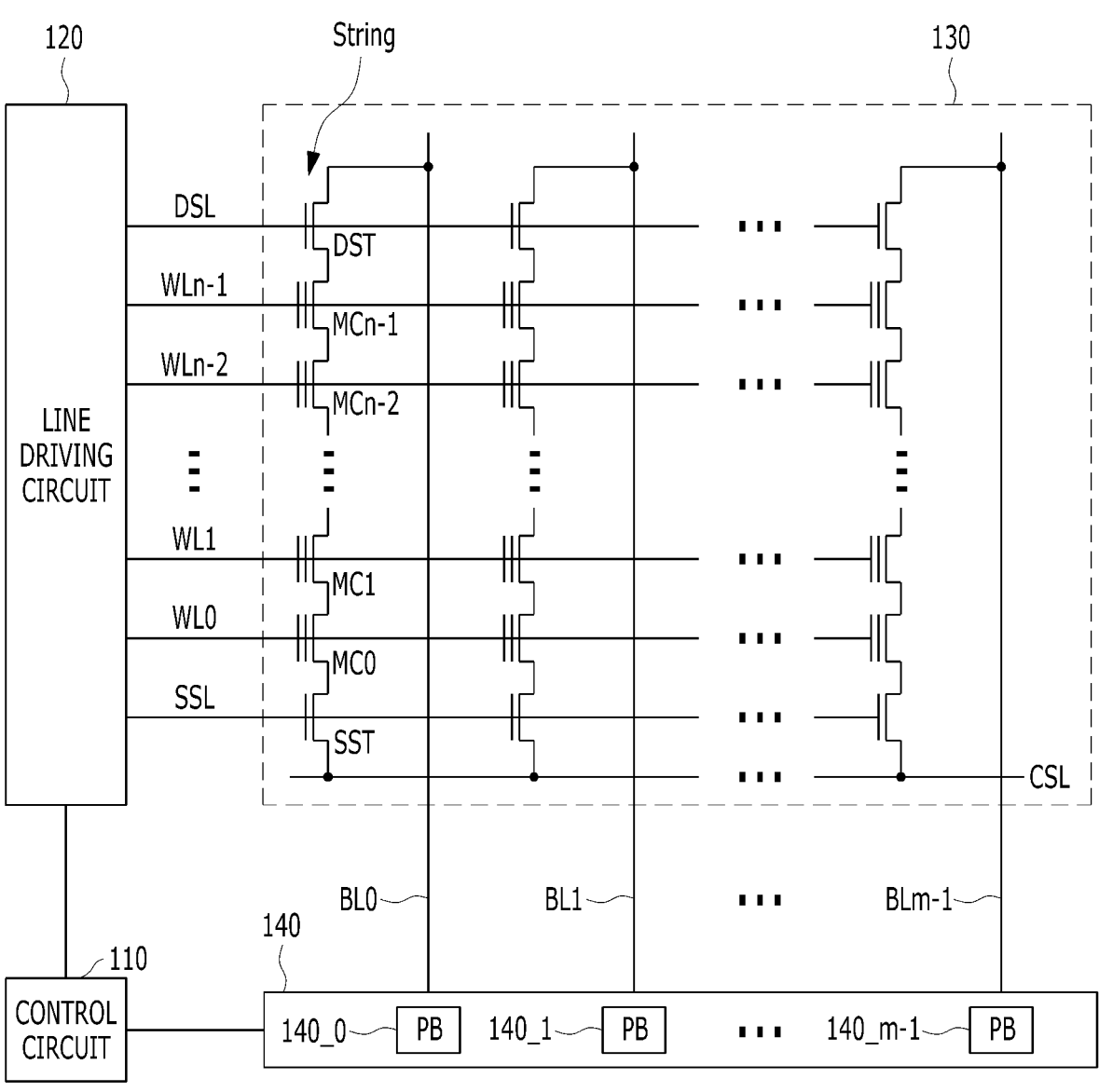
FIG. 1 is a diagram illustrating a construction of a semiconductor device according to an embodiment of the present disclosure.

FIG. 1 is a diagram illustrating a construction of a semiconductor device according to an embodiment of the present disclosure.

Referring to FIG. 1, a semiconductor device 100 according to an embodiment of the present disclosure may include a control circuit 110, a line driving circuit 120, a cell string group 130, and a page buffer group 140.

The control circuit 110 may program data into the cell string group 130 or erase data that has been programmed into the cell string group 130 by controlling the line driving circuit 120, the cell string group 130, and the page buffer group 140.

The line driving circuit 120 may drive a drain selection line DSL, word lines WL0 to WLn−1, and a source selection line SSL to internal voltage levels under the control of the control circuit 110. After the start of a program operation, the line driving circuit 120 may apply a program voltage to at least one of the word lines WL0 to WLn−1 as an internal voltage, under the control of the control circuit 110.

The cell string group 130 may include cell strings String. The cell strings may be connected between respective bit lines BL0 to BLm−1 and a source line CSL. The cell string may include a drain selection transistor DST, a plurality of cell transistors MC0 to MCn−1, and a source selection transistor SST. In this case, the cell strings may have the same components. However, the names of signals that are input to the components or lines that are connected to the components may vary.

A cell string may include the drain selection transistor DST, the plurality of cell transistors MC0 to MCn−1, and the source selection transistor SST that are connected in series between the bit line BL0 and the source line CSL.

The drain selection transistor DST may have a gate to which the drain selection line DSL is connected and may have a drain and a source to which the bit line BL0 and the cell transistor MCn−1 are connected, respectively.

The plurality of cell transistors MC0 to MCn−1 may be connected in series between the drain selection transistor DST and the source selection transistor SST. The plurality of word lines WL0 to WLn−1 may be connected to the gates of the plurality of cell transistors MC0 to MCn−1, respectively. In this case, each of the plurality of cell transistors MC0 to MCn−1 may play a role as a memory cell that data can be programmed into or erased from. Hereinafter, each of the plurality of cell transistors MC0 to MCn−1 will be referred to as a memory cell.

The source selection transistor SST may have a gate to which the source selection line SSL is connected and may have a drain and a source to which the cell transistor MC0 and the source line CSL are connected, respectively.

The page buffer group 140 may include a plurality of page buffers (PB) 140_0 to 140_m−1. The plurality of bit lines BL0 to BLm−1 may be connected to the plurality of page buffers 140_0 to 140_m−1, respectively. The plurality of page buffers 140_0 to 140_m−1 may sense threshold voltages of the memory cells MC0 to MCn−1 through the respective bit lines BL0 to BLm−1 that are connected to the plurality of page buffers 140_0 to 140_m−1. The page buffer group 140 may provide the control circuit 110 with a sensing value of the threshold voltage of a memory cell, which has been sensed by at least one of the plurality of page buffers 140_0 to 140_m−1.

The semiconductor device 100, as described above, may program at least one of the plurality of memory cells MC0 to MCn−1 by repeatedly providing at least one of the plurality of word lines WL0 to WLn−1 with a program pulse having the voltage level of a program voltage. At this time, the source line CSL or at least one of the plurality of bit lines BL0 to BLm−1 may be at a ground voltage level. In this case, the voltage level of the program pulse, that is, the voltage level of the program voltage, may be increased whenever the program pulse is provided to the word line.

Figure 2:
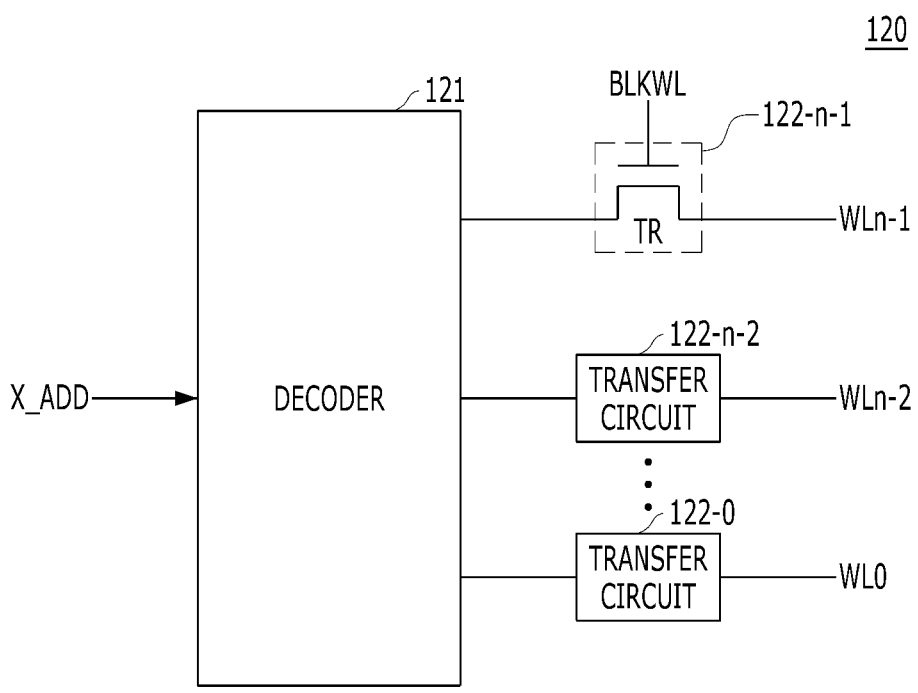
FIG. 2 is a diagram conceptually illustrating a construction of a line driving circuit of the semiconductor device according to an embodiment of the present disclosure.

FIG. 2 is a diagram conceptually illustrating a construction of the line driving circuit of the semiconductor device according to an embodiment of the present disclosure.

The line driving circuit 120 may receive a row address X_ADD from the control circuit 110 and may provide a program pulse to at least one of the plurality of word lines WL0 to WLn−1 based on the row address X_ADD. In this case, the program pulse that is provided from the line driving circuit 120 to the word line may be a signal that is enabled to a program voltage level for a given time. That is, the line driving circuit 120 may apply a voltage of the program pulse to the word line for the interval in which the program pulse is enabled.

Referring to FIG. 2, the line driving circuit 120 may include a decoder 121 and a plurality of transfer circuits 122-0 to 122-n−1.

The decoder 121 may provide a program pulse to at least one of the plurality of transfer circuits 122-0 to 122-n−1 based on the row address X_ADD. For example, the decoder 121 may repeatedly provide the program pulse until a threshold voltage level of a memory cell reaches a target level and may raise the voltage level of the program pulse as the number of times that the program pulse is provided increases.

Each of the plurality of transfer circuits 122-0 to 122-n−1 may transfer a program pulse that is provided by the decoder 121, that is, a program voltage, to each of the plurality of word lines WL0 to WLn−1. For example, each of the plurality of transfer circuits 122-0 to 122-n−1 may transfer the output of the decoder 121, that is, a program voltage, to each of the word lines WL0 to WLn−1 under the control of transfer control signals BLKWL.

Each of the plurality of transfer circuits 122-0 to 122-n−1 may include a transistor TR. In this case, the plurality of transfer circuits 122-0 to 122-n−1 may be the same. However, the names of signals that are input to the transfer circuits or lines that are connected to the transfer circuits may vary. Therefore, the construction of the last transfer circuit 122-n−1 of the plurality of transfer circuits 122-0 to 122-n−1 is representatively described.

The transfer circuit 122-n−1 may include the transistor TR having a gate through which the transfer control signal BLKWL is received and a drain and a source to which the decoder 121 and the word line WLn−1 are connected, respectively. In this case, the transistor TR may be an N type transistor. Therefore, as the level of a program voltage to be transferred from the decoder 121 to the word line WLn−1 increases, the transfer circuit 122-n−1 may receive the transfer control signal BLKWL having a higher voltage level. The voltage level of the transfer control signal BLKWL may be adjusted by the control circuit 110.

Figure 3:
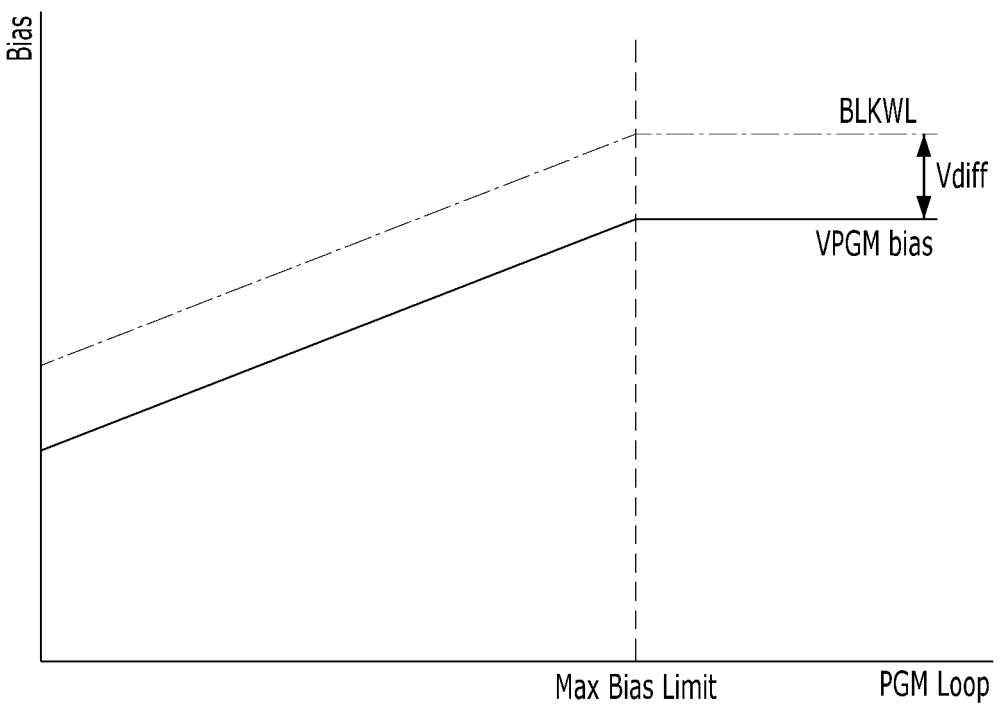
FIG. 3 is a graph illustrating a program operation of a semiconductor device according to an embodiment of the present disclosure.

FIG. 3 is a graph illustrating a program operation of a semiconductor device according to an embodiment of the present disclosure.

A semiconductor device according to an embodiment of the present disclosure may perform a program operation that repeatedly provides a program pulse to a memory cell until a threshold voltage level of the memory cell increases to a target level. In this case, the voltage level of the program pulse may increase whenever the program pulse is provided to the memory cell.

Referring to FIG. 3, the semiconductor device of the present disclosure may raise a voltage of a program pulse, that is, the level of a program voltage VPGM bias, whenever the program pulse is provided to a memory cell. In this case, the level of the program voltage VPGM bias may be raised up to the level of a maximum voltage (Max Bias Limit).

In order to transfer, to a word line, the program voltage VPGM bias having a level that is raised whenever the program pulse is provided to the memory cell, the semiconductor device may raise the voltage level of the transfer control signal BLKWL by the same voltage increment as the level of the program voltage VPGM bias. The reason for this may be that the transfer circuit that transfers the program voltage to the word line includes the N type transistor.

As a result, the semiconductor device may adjust the voltage level of the transfer control signal BLKWL so that the transfer control signal BLKWL has a fixed voltage level difference Vdiff with the program voltage VPGM bias.

Figure 4:
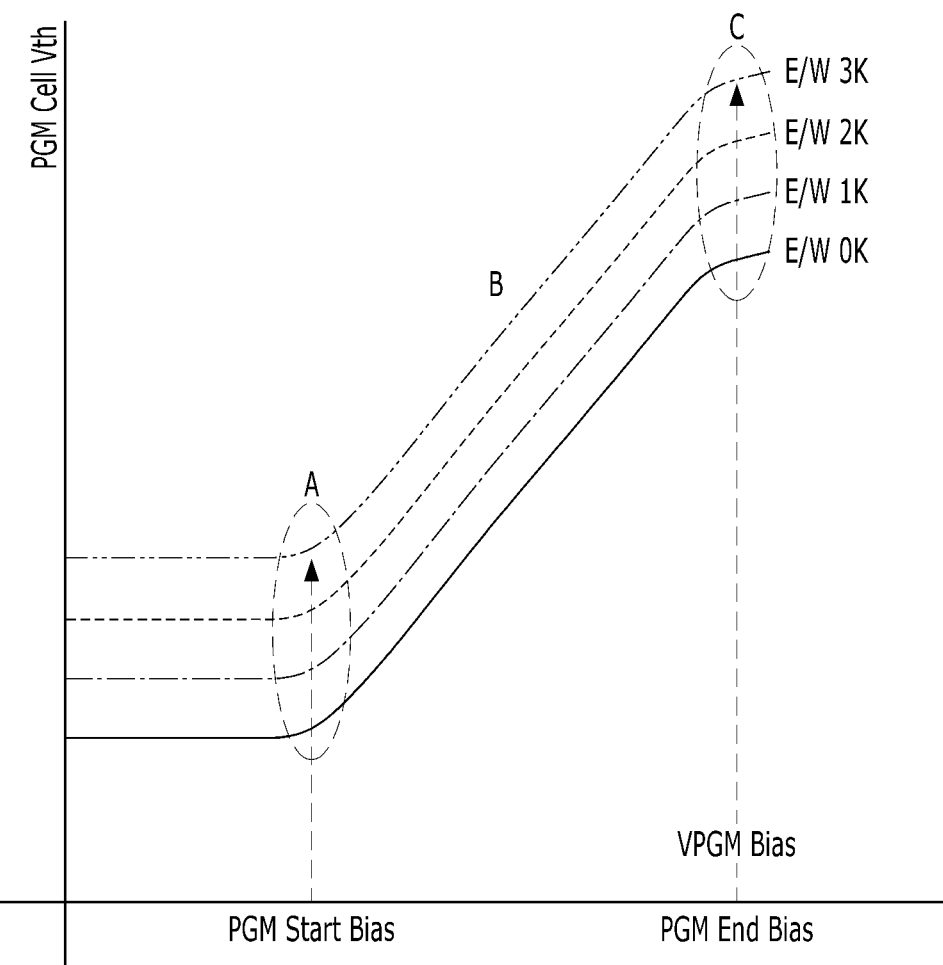
FIG. 4 is a graph illustrating threshold voltages of a memory cell according to program and erase counts of a semiconductor device according to an embodiment of the present disclosure.

FIG. 4 is a graph illustrating threshold voltages of a memory cell according to program and erase counts of a semiconductor device according to an embodiment of the present disclosure.

Referring to FIG. 4, as a program/erase count (E/W) is increased (e.g., 0K, 1K, 2K, and 3K, wherein 0K<1K<2K<3K), threshold voltage levels of a programmed memory cell may increase. That is, the threshold voltage level of the programmed memory cell may be higher when the program/erase count is 1K than when the program/erase count is 0K. The threshold voltage level of the programmed memory cell may be higher when the program/erase count is 2K than when the program/erase count is 1K. The threshold voltage level of the programmed memory cell may be higher when the program/erase count is 3K than when the program/erase count is 2K.

Accordingly, in the semiconductor device according to an embodiment of the present disclosure, a threshold voltage distribution of a memory cell may deteriorate more quickly as the program/erase count increases since the threshold voltage level of the programmed memory cell increases as the program/erase count increases.

Furthermore, the program efficiency at timing A and timing C may be lower than the program efficiency at timing B. That is, a change (or slope) in the threshold voltage level of a programmed memory cell at each of the timing A and the timing C may be smaller than a change (or slope) in the threshold voltage level of the memory cell at the timing B. In this case, the timing A may include the timing (PGM Start Bias) at which a program operation starts and the voltage level of the program voltage VPGM Bias of the program pulse starts to increase. The timing C may include the timing (PGM End Bias) at which the voltage level of the program voltage VPGM Bias of the program pulse reaches a maximum voltage level.

Accordingly, in the semiconductor device according to an embodiment of the present disclosure, the program efficiency may be low at the timing A at which the program operation starts and the voltage level of the program pulse starts to increase and the timing C at which the voltage level of the program voltage of the program pulse reaches the maximum voltage level.

FIGS. 5 to 10 are graphs illustrating program operations of a semiconductor device according to another embodiment of the present disclosure. Program operations of the semiconductor device according to another embodiment of the present disclosure, which can improve threshold voltage distributions and program efficiency of programmed memory cells compared to the semiconductor device according to the previously disclosed embodiment of the present disclosure, are described with reference to FIGS. 5 to 10.

Figure 5:
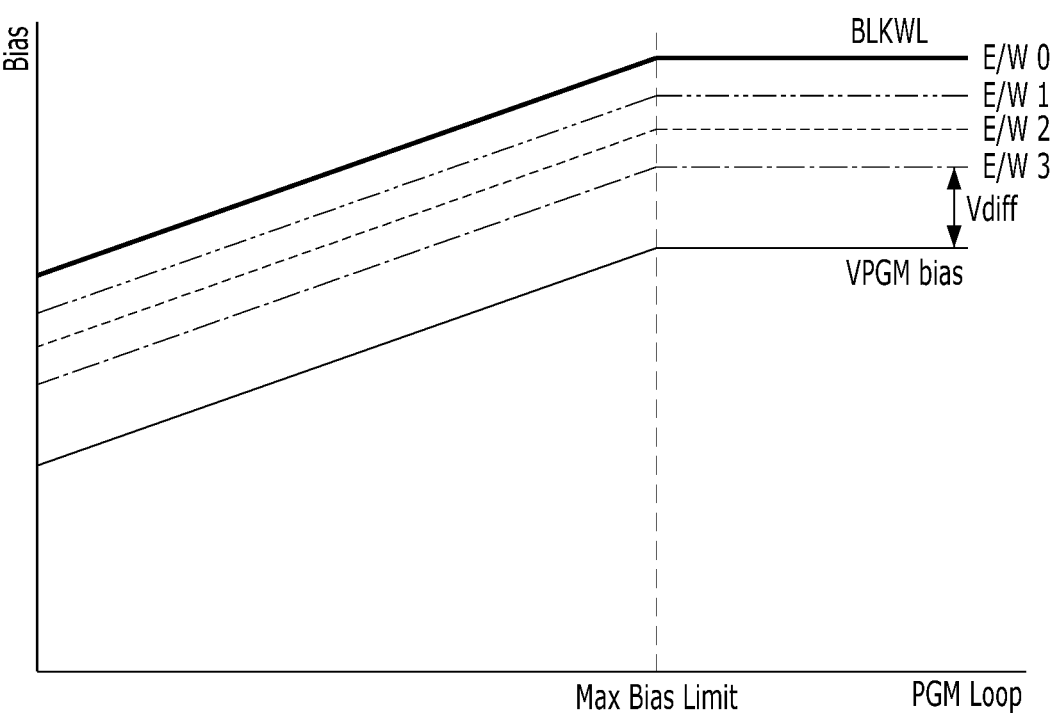
FIGS. 5 to 10 are graphs illustrating program operations of a semiconductor device according to another embodiment of the present disclosure.

Referring to FIG. 5, the semiconductor device according to another embodiment of the present disclosure may adjust the voltage level of the transfer control signal BLKWL after the start of a program operation based on the program/erase counts (e.g., E/W 0K, E/W 1K, E/W 2K, and E/W 3K). For example, the semiconductor device may lower the voltage level of the transfer control signal BLKWL as the program/erase counts are increased (e.g., E/W 0K, E/W 1K, E/W 2K, and E/W 3K). In this case, a difference between the voltage level of the transfer control signal BLKWL corresponding to the greatest program/erase count and the voltage level of the program voltage VPGM Bias of a program pulse may be a preset voltage difference Vdiff. That is, the difference between the voltage level of the program voltage VPGM Bias of the program pulse and the voltage level of the transfer control signal BLKWL may be equal to or greater than the preset voltage difference Vdiff.

Accordingly, the semiconductor device may adjust the difference between the voltage level of the transfer control signal BLKWL and the voltage level of the program voltage VPGM Bias of the program pulse based on a program/erase count.

For example, the semiconductor device may adjust the voltage level of the transfer control signal BLKWL so that a difference between the voltage level of the transfer control signal BLKWL and the voltage level of the program voltage VPGM Bias of a program pulse decreases to a preset voltage difference Vdiff as the program/erase count increases. Furthermore, the semiconductor device may adjust the voltage level of the transfer control signal BLKWL so that a difference between the voltage level of the transfer control signal BLKWL and the voltage level of the program voltage VPGM Bias of the program pulse is greater than a preset voltage difference Vdiff as the program/erase count is lower (i.e., E/W 2K, E/W 1K, or E/W 0K).

As a result, the semiconductor device can lower the voltage level of the program voltage of a program pulse that is transferred to a word line by lowering the voltage level of the transfer control signal BLKWL so that a difference between the voltage level of the program voltage VPGM Bias of the program pulse and the voltage level of the transfer control signal BLKWL decreases as the program/erase count increases. Therefore, the semiconductor device can improve a threshold voltage distribution of memory cells after the start of a program operation by lowering the voltage level of the transfer control signal BLKWL as the program/erase count increases so that the threshold voltage of a memory cell is prevented from rapidly moving to a program state.

Figure 6:
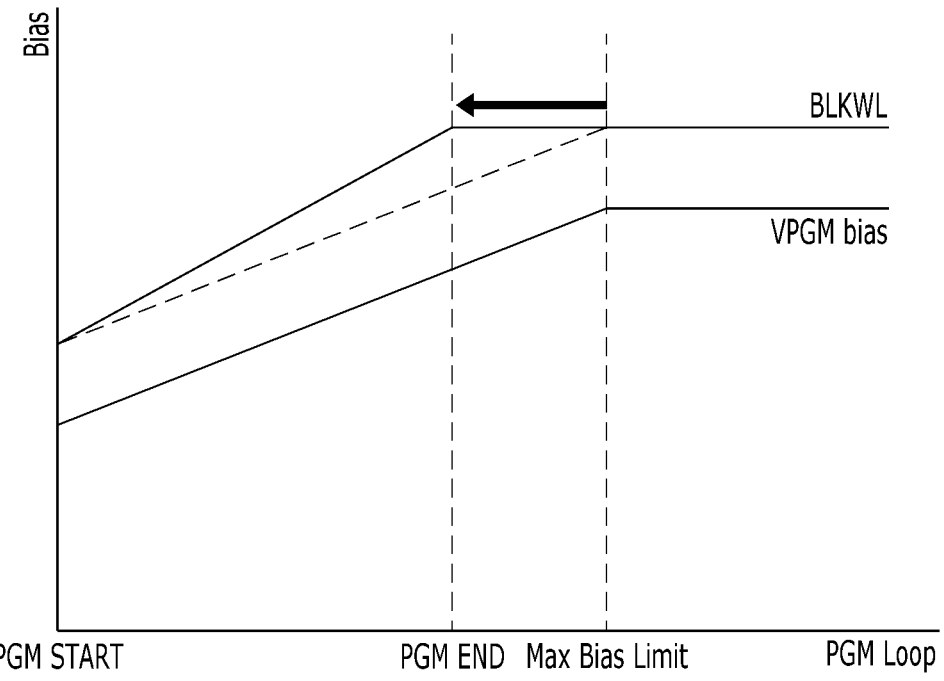
Figure 7:
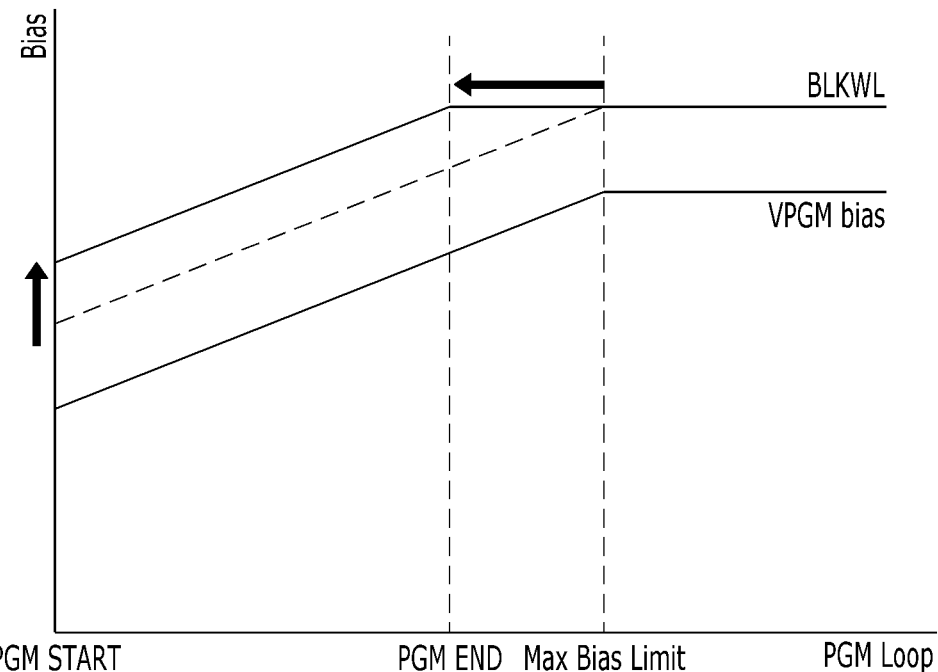

Referring to FIGS. 6 and 7, the semiconductor device according to another embodiment of the present disclosure may adjust the voltage level of the transfer control signal BLKWL so that the voltage level of the transfer control signal BLKWL reaches a maximum voltage level at a timing that is earlier than the timing at which the voltage level of the program voltage VPGM Bias of a program pulse reaches a maximum voltage level. In this case, the timing at which the voltage level of the program voltage VPGM Bias of the program pulse reaches the maximum voltage level may be Max Bias Limit, and the timing at which the voltage level of the transfer control signal BLKWL reaches the maximum voltage level may be PGM END.

FIG. 6 is a graph illustrating a case in which the semiconductor device adjusts the voltage level of the transfer control signal BLKWL so that an increment (or slope) of the voltage level of the transfer control signal BLKWL is higher than an increment (or slope) of the voltage level of the program voltage VPGM bias of a program pulse after the start of a program operation, resulting in the voltage level of the transfer control signal BLKWL reaching the maximum voltage level (PGM END) earlier than the timing at which the voltage level of the program voltage VPGM bias of a program pulse reaches the maximum voltage level (Max Bias Limit). As described above, by raising an increment of the voltage level of the transfer control signal BLKWL, the semiconductor device can increase the voltage level of the transfer control signal BLKWL in such a way that it reaches the maximum voltage level (PGM END) earlier than the maximum voltage level (Max Bias Limit) of the program voltage VPGM bias of the program pulse.

FIG. 7 is a graph illustrating a case in which the semiconductor device increases the voltage level of the transfer control signal BLKWL in such a way that it has the same increment as the voltage level of the program voltage VPGM bias of the program pulse after the start of a program operation and adjusts the initial voltage level of the transfer control signal BLKWL to be high (higher than the initial voltage level shown in FIG. 6) after the start of the program operation, resulting in the voltage level of the transfer control signal BLKWL reaching the maximum voltage level (PGM END) at a timing that is earlier than the timing at which the voltage level of the program voltage VPGM bias of a program pulse reaches the maximum voltage level (Max Bias Limit). As described above, by adjusting the voltage level of the transfer control signal BLKWL to have the same increment as the voltage level of the program voltage VPGM bias of the program pulse and adjusting the initial voltage level of the transfer control signal BLKWL to be high after the start of a program operation, the semiconductor device can increase the voltage level of the transfer control signal BLKWL in such a way that it reaches the maximum voltage level (PGM END) earlier than the maximum voltage level (Max Bias Limit) of the program voltage VPGM bias of a program pulse.

As in FIGS. 6 and 7, the semiconductor device can increase the voltage level of the transfer control signal BLKWL in such a way that it reaches the maximum voltage level (PGM END) before the voltage level of the program voltage VPGM bias of a program pulse reaches the maximum voltage level (Max Bias Limit). Accordingly, when the voltage level of a program voltage of a program pulse reaches a maximum voltage level in a program operation, the program efficiency can be improved because the voltage level of the program voltage of the program pulse that is transferred to a word line may be prevented from decreasing.

Furthermore, the semiconductor device, which operates as in FIG. 7, can improve program efficiency at the early stage of a program operation, that is, when a voltage of a program pulse is applied to a word line for the first time, by raising the voltage level of the transfer control signal at the early stage of the program operation so that the voltage level of the program pulse is prevented from being decreased.

Figure 8:
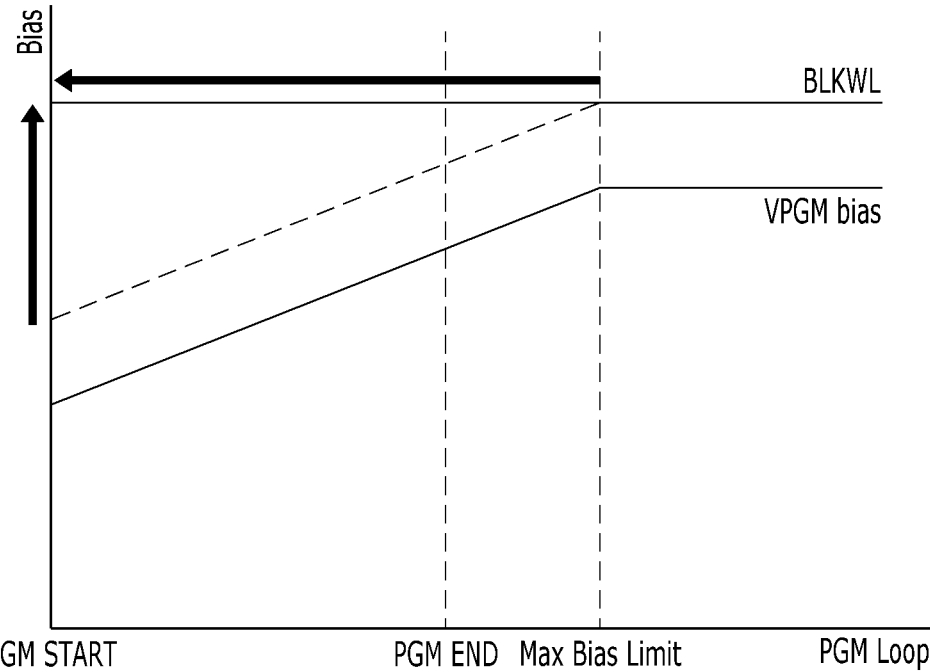

FIG. 8 is a graph illustrating a case in which the semiconductor device according to another embodiment of the present disclosure maintains the voltage level of the transfer control signal BLKWL at the maximum voltage level (PGM END) from the start of a program operation.

As in FIG. 8, if the semiconductor device maintains the voltage level of the transfer control signal BLKWL at the maximum voltage level (PGM END) after the start of a program operation, the voltage level of the program voltage of a program pulse can be prevented from being decreased and transferred to a word line, when the voltage level of the program pulse is provided to the word line for the first time and the voltage level of the program voltage of the program pulse reaches the maximum voltage level (Max Bias Limit). Accordingly, the semiconductor device according to another embodiment of the present disclosure can improve program efficiency after the start of a program operation.

Figure 9:
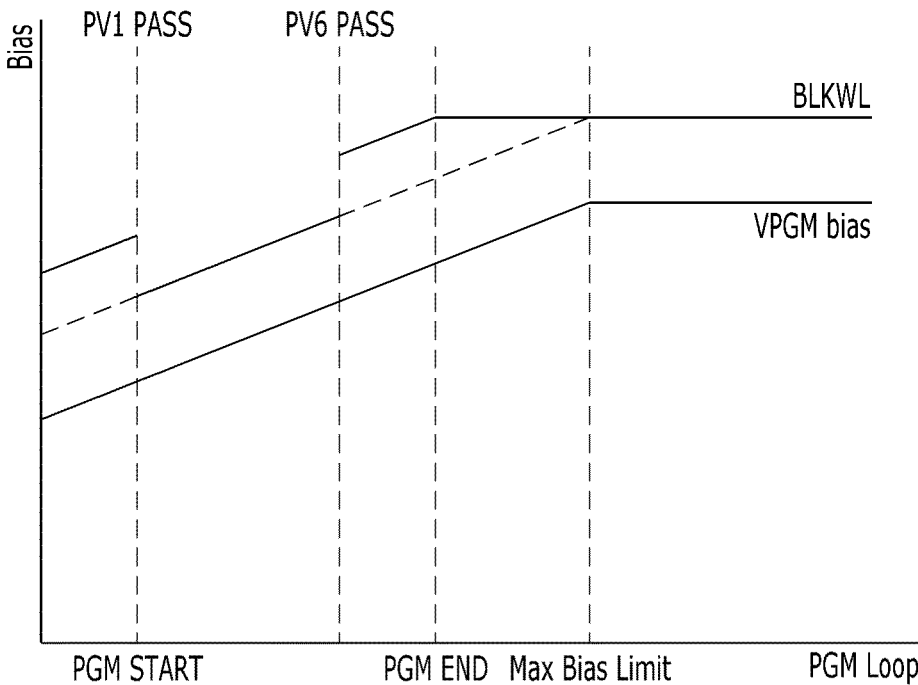

FIG. 9 is a graph illustrating an operation of the semiconductor device according to another embodiment of the present disclosure, adjusting the voltage level of the transfer control signal BLKWL based on the results of a program verification operation. In this case, a memory cell may be a memory cell having eight voltage distributions including an erase state, and six program verification operations may be performed on the memory cell after the start of a program operation. In FIG. 9, a semiconductor device including a memory cell that has eight voltage distributions and on which six program verification operations are performed has been described as an example, but the present disclosure is not limited thereto.

Referring to FIG. 9, the semiconductor device may adjust the voltage level of the transfer control signal BLKWL based on the results of a first program verification operation PV1 and a sixth program verification operation PV6. In this case, a difference between the voltage level of the transfer control signal BLKWL and the voltage level of the program voltage VPGM bias of a program pulse during an interval between the first program verification operation PV1 and the sixth program verification operation PV6 may be a preset voltage level. Furthermore, the difference between the voltage level of the transfer control signal BLKWL and the voltage level of the program voltage VPGM bias of the program pulse may be greater than the preset voltage level from the start of a program operation until a result of the first program verification operation PV1 is a pass (PV1 PASS). Furthermore, the difference between the voltage level of the transfer control signal BLKWL and the voltage level of the program voltage VPGM bias of the program pulse may be greater than the preset voltage level until a result of the sixth program verification operation PV6 is a pass (PV6 PASS).

As a result, the semiconductor device may lower the voltage level of the transfer control signal BLKWL when a result of the first program verification operation PV1 is a pass (PV1 PASS) and may raise the voltage level of the transfer control signal BLKWL when a result of the sixth program verification operation PV6 is a pass (PV6 PASS). In this case, during an interval from the first program verification operation to the sixth program verification operation, a difference between the voltage level of the transfer control signal BLKWL and the voltage level of the program voltage VPGM bias of the program pulse may be a preset voltage level.

Accordingly, the semiconductor device can improve program efficiency by raising the voltage level of the transfer control signal BLKWL at an initial program timing and timing before the program voltage VPGM reaches a maximum voltage.

Figure 10:
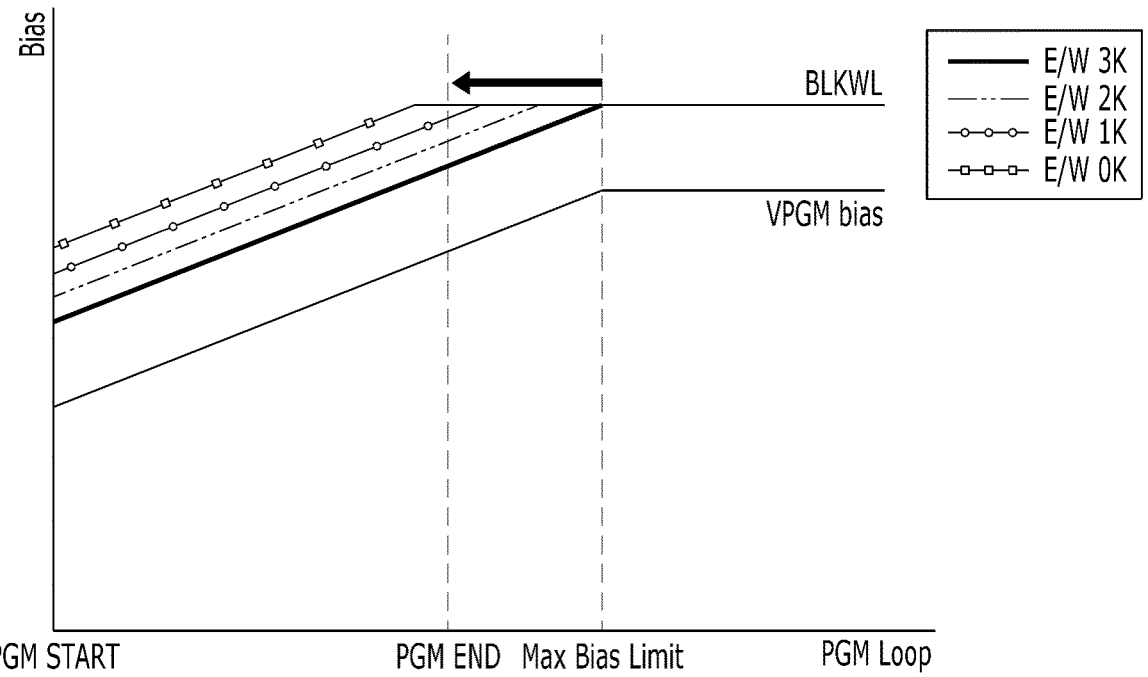

FIG. 10 is a graph illustrating a program operation in which the program operations of the semiconductor device according to another embodiment of the present disclosure in which FIGS. 5 and 7 are combined.

A program operation of controlling the voltage level of the transfer control signal BLKWL based on the program/erase count has been described with reference to FIG. 5 as described above. A program operation for improving program efficiency after the start of a program operation has been described with reference to FIG. 7.

Referring to FIG. 10, the semiconductor device may generate the transfer control signal BLKWL, the voltage level of which rises with the same increment as the voltage level of the program voltage VPGM bias of a program pulse. At this time, based on a program/erase count, the semiconductor device may determine the voltage level of the transfer control signal BLKWL after the start of a program operation. For example, the semiconductor device may adjust the voltage level of the transfer control signal BLKWL so that the first voltage level of the transfer control signal BLKWL is lowered after the start of a program operation as the program/erase count increases.

Referring to FIG. 10, the semiconductor device can improve a program distribution of a memory cell by reducing a difference between the voltage level of the program voltage VPGM bias of a program pulse and the voltage level of the transfer control signal BLKWL as the program/erase count increases after the start of a program operation and can improve program efficiency by making the voltage level of the transfer control signal BLKWL reach the maximum voltage level (PGM END) at a timing that is earlier than the timing at which the voltage level of the program voltage VPGM bias of the program pulse reaches the maximum voltage level (Max Bias Limit).

FIG. 10 illustrates a combination of operations of the semiconductor device according to other embodiments of the present disclosure, which have been described with reference to FIGS. 5 and 7. Those skilled in the art may easily practice the principle of the present disclosure in which a difference between the voltage level of the program voltage of a program pulse and the voltage level of the transfer control signal is adjusted based on a program/erase count is combined with a program operation that is described in another drawing.

Figure 11:
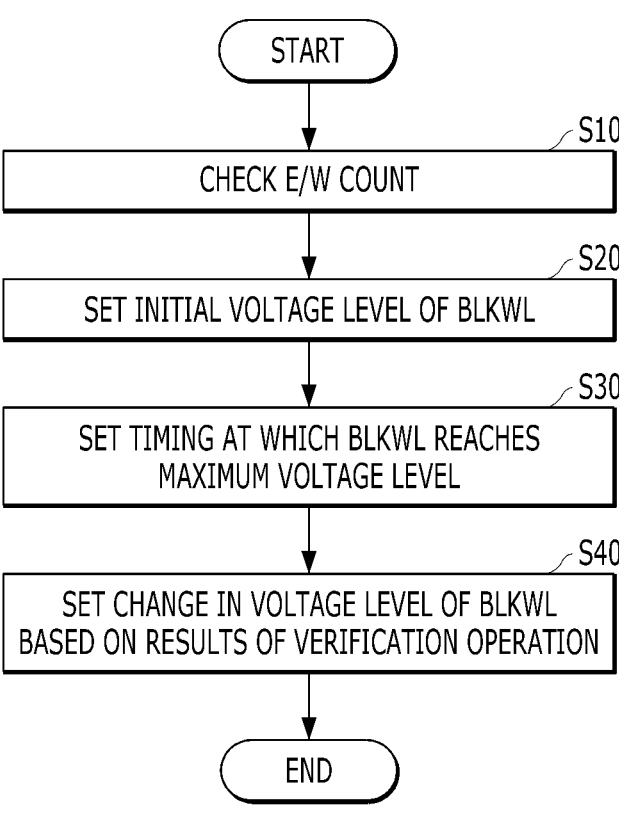
FIG. 11 is a flowchart illustrating a program operation of a semiconductor device according to another embodiment of the present disclosure.

FIG. 11 is a flowchart illustrating a program operation of a semiconductor device according to another embodiment of the present disclosure.

A program operation method of the semiconductor device may include step S10 of checking a program/erase (E/W) count, a step S20 of setting an initial voltage level of the transfer control signal BLKWL, step S30 of setting timing at which the voltage level of the transfer control signal BLKWL reaches a maximum voltage level, and step S40 of setting a change in the voltage level of the transfer control signal BLKWL based on a result of a verification operation.

Step S10 of checking the program/erase (E/W) count may include a step of checking a program or erase operation count of a memory cell after the start of a program operation.

Step S20 of setting the initial voltage level of the transfer control signal BLKWL may include a step of setting the initial voltage level of the transfer control signal BLKWL based on a program/erase count. For example, step S20 of setting the initial voltage level of the transfer control signal BLKWL may include a step of lowering the initial voltage level of the transfer control signal BLKWL as the program/ erase count increases.

Step S30 of setting the timing at which the voltage level of the transfer control signal BLKWL reaches the maximum voltage level may include a step of setting an increment of the voltage level of the transfer control signal BLKWL so that the timing at which the voltage level of the transfer control signal BLKWL reaches the maximum voltage level is earlier than the timing at which the voltage level of a program pulse reaches a maximum voltage level. For example, the step S30 of setting the timing at which the voltage level of the transfer control signal BLKWL reaches the maximum voltage level may include a step of adjusting an increment of the voltage level of the transfer control signal BLKWL to be identical with an increment of the voltage level of the program pulse when an initial voltage level of the transfer control signal BLKWL is set to be high based on a program/erase count. Furthermore, the step S30 of setting the timing at which the voltage level of the transfer control signal BLKWL reaches the maximum voltage level may include a step of adjusting an increment of the voltage level of the transfer control signal BLKWL so that an increment of the voltage level of the transfer control signal BLKWL is greater than an increment of the voltage level of the program pulse.

Step S40 of setting a change in the voltage level of the transfer control signal BLKWL based on a result of the verification operation may include a step of setting a change in the voltage level of the transfer control signal based on the results of program verification operations corresponding to a plurality of pieces of timing.

For example, step S40 of setting a change in the voltage level of the transfer control signal BLKWL based on the results of a verification operation may include a step of lowering the voltage level of the transfer control signal based on the results of a program verification operation at first timing. Furthermore, step S40 of setting a change in the voltage level of the transfer control signal BLKWL based on the results of a verification operation may include a step of raising the voltage level of the transfer control signal based on the results of a program verification operation at second timing. In this case, the results of program verification operations corresponding to a plurality of pieces of timing may include the results of a plurality of program verification operations. The results of the program verification operation at the first timing may be the results of the first program verification operation, among the plurality of program verification operations. The results of the program verification operation at the second timing may be the results of the last program verification operation, among the plurality of program verification operations.

Although embodiments according to the technical spirit of the present disclosure have been described above with reference to the accompanying drawings, the embodiments have been provided to merely describe embodiments according to the concept of the present disclosure, and the present disclosure is not limited to the embodiments. A person having ordinary knowledge in the art to which the present disclosure pertains may substitute, modify, and change the embodiments in various ways without departing from the technical spirit of the present disclosure written in the claims. Such substitutions, modifications, and changes may be said to belong to the scope of the present disclosure.

What is claimed is:

1. A semiconductor device comprising:
a plurality of transfer circuits configured to transfer a program pulse to at least one of a plurality of word lines based on a transfer control signal;
a decoder configured to provide the program pulse to at least one of the plurality of transfer circuits based on a row address; and
a control circuit configured to adjust a voltage level of the transfer control signal based on a program/erase count,
wherein the transfer circuits receive the transfer control signal,
wherein an initial voltage level of the transfer control signal lowers as the program/erase count increases.

2. The semiconductor device of claim 1,
wherein the control circuit lowers the voltage level of the transfer control signal as the program/erase count increases.

3. The semiconductor device of claim 1,
wherein the decoder repeatedly provides the program pulse until a threshold voltage level of a memory cell reaches a target level and raises a voltage level of the program pulse as a number of times that the program pulse is provided increases.

4. The semiconductor device of claim 3,
wherein the control circuit adjusts the voltage level of the transfer control signal so that a difference between the voltage level of the program pulse and the voltage level of the transfer control signal is equal to or greater than a preset voltage level.

5. The semiconductor device of claim 4,
wherein the control circuit adjusts the voltage level of the transfer control signal so that a timing at which the voltage level of the transfer control signal reaches a maximum voltage level is earlier than a timing at which the voltage level of the program pulse reaches a maximum voltage level.

6. The semiconductor device of claim 5,
wherein the control circuit adjusts the voltage level of the transfer control signal so that an increment of the voltage level of the transfer control signal is greater than an increment of the voltage level of the program pulse.

7. The semiconductor device of claim 5,
wherein the control circuit adjusts the voltage level of the transfer control signal so that an increment of the voltage level of the transfer control signal and an increment of the voltage level of the program pulse are identical with each other, and
wherein an initial voltage level of the transfer control signal is greater than the preset voltage level after a start of a program operation.

8. The semiconductor device of claim 5,
wherein the control circuit adjusts the voltage level of the transfer control signal so that the voltage level of the transfer control signal is maintained at a voltage level that is higher than the maximum voltage level of the program pulse by the preset voltage level.

9. The semiconductor device of claim 5,
wherein the control circuit adjusts the voltage level of the transfer control signal based on results of a program verification operation at a first timing and results of a program verification operation at a second timing.

10. The semiconductor device of claim 9,
wherein the control circuit adjusts the voltage level of the transfer control signal so that the difference between the voltage level of the program pulse and the voltage level of the transfer control signal becomes the preset voltage level during an interval between the first timing and the second timing.

11. The semiconductor device of claim 10,
wherein, during an interval until the first timing from a start of a program operation and an interval in which the voltage level of the transfer control signal reaches the maximum voltage level from the second timing, the control circuit adjusts the voltage level of the transfer control signal so that the difference between the voltage level of the program pulse and the voltage level of the transfer control signal is greater than the preset voltage level.

12. A semiconductor device comprising:
a plurality of transfer circuits configured to transfer a program pulse to at least one of a plurality of word lines based on a transfer control signal;
a decoder configured to provide the program pulse to at least one of the plurality of transfer circuits based on a row address; and
a control circuit configured to adjust a voltage level of the transfer control signal so that a timing at which the voltage level of the transfer control signal reaches a maximum voltage level is earlier than a timing at which a voltage level of the program pulse reaches a maximum voltage level,
wherein the transfer circuits receive the transfer control signal,
wherein an initial voltage level of the transfer control signal lowers as the program/erase count increases.

13. The semiconductor device of claim 12,
wherein the control circuit adjusts the voltage level of the transfer control signal so that an increment of the voltage level of the transfer control signal is identical with an increment of the voltage level of the program pulse, and
wherein a difference between the voltage level of the program pulse and the voltage level of the transfer control signal is greater than a preset voltage level.

14. The semiconductor device of claim 12,
wherein the control circuit adjusts the voltage level of the transfer control signal so that an increment of the voltage level of the transfer control signal is greater than an increment of the voltage level of the program pulse.

15. The semiconductor device of claim 12,
wherein the control circuit adjusts the voltage level of the transfer control signal so that the transfer control signal maintains the maximum voltage level.

16. An operating method of a semiconductor device, comprising:
setting an initial voltage level of a transfer control signal based on a program/erase count after a start of a program operation;
setting an increment of a voltage level of the transfer control signal so that a timing at which the voltage level of the transfer control signal reaches a maximum voltage level is earlier than a timing at which a voltage level of a program pulse reaches a maximum voltage level; and
setting a change in the voltage level of the transfer control signal based on results of program verification operations corresponding to a plurality of pieces of timing,
wherein a transfer circuit receives a transfer control signal and transfers a program pulse to a word line based on the transfer control signal,
wherein the setting of the initial voltage level comprises lowering the initial voltage level of the transfer control signal as the program/erase count increases.

17. The operating method of claim 16,
wherein the setting of the increment of the voltage level comprises setting the increment of the voltage level of the transfer control signal so that the increment of the voltage level of the transfer control signal is identical with an increment of the voltage level of the program pulse.

18. The operating method of claim 16,
wherein the setting of the increment of the voltage level comprises setting the increment of the voltage level of the transfer control signal so that the increment of the voltage level of the transfer control signal is greater than an increment of the voltage level of the program pulse.

19. The operating method of claim 16,
wherein the plurality of pieces of timing comprises a first timing and a second timing, and
wherein the first timing is earlier than the second timing.

20. The operating method of claim 19,
wherein the setting of the change in the voltage level of the transfer control signal comprises lowering the voltage level of the transfer control signal based on results of a program verification operation at the first timing.

21. The operating method of claim 19,
wherein the setting of the change in the voltage level of the transfer control signal comprises raising the voltage level of the transfer control signal based on results of a program verification operation at the second timing.

* * * * *